(12) United States Patent
Miluzzi

(10) Patent No.: US 9,553,571 B1
(45) Date of Patent: Jan. 24, 2017

(54) RESET CIRCUITRY FOR MITIGATING OFFSETS IN A MEMS DEVICE INTERPOLATOR

(71) Applicant: STMICROELECTRONICS S.R.L., Agrate Brianza (IT)

(72) Inventor: Eugenio Miluzzi, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/947,886

(22) Filed: Nov. 20, 2015

(51) Int. Cl.
*H03L 5/00* (2006.01)
*H03K 5/135* (2006.01)
*H03K 5/00* (2006.01)

(52) U.S. Cl.
CPC ..... *H03K 5/135* (2013.01); *H03K 2005/00052* (2013.01)

(58) Field of Classification Search
CPC .............. H03F 3/45475; H03F 3/45183
USPC ....... 327/427, 434, 437, 307, 306, 378, 379, 327/108–112; 326/82, 83, 87; 381/111; 341/124, 155; 323/270, 271
See application file for complete search history.

(56) References Cited

U.S. PATENT DOCUMENTS

| | | | | |
|---|---|---|---|---|
| 4,125,812 A * | 11/1978 | Polonio | ............... | H04B 14/006 327/167 |
| 4,250,493 A * | 2/1981 | Kihara | .................. | F02D 41/28 323/270 |
| 7,324,035 B2 * | 1/2008 | Harris | .................... | H03F 3/185 341/155 |
| 7,605,729 B2 * | 10/2009 | Nam | ...................... | H03M 1/50 341/124 |
| 2008/0224754 A1 * | 9/2008 | Wei | ...................... | H04L 25/085 327/307 |
| 2014/0176231 A1 * | 6/2014 | Spinella | ................. | G05F 1/625 327/538 |
| 2015/0237432 A1 * | 8/2015 | Miluzzi | .................. | H04R 1/08 381/111 |
| 2016/0146852 A1 * | 5/2016 | Romano | .................. | H03F 3/70 73/488 |

* cited by examiner

*Primary Examiner* — Lincoln Donovan
*Assistant Examiner* — Thomas Skibinski
(74) *Attorney, Agent, or Firm* — Seed IP Law Group LLP

(57) ABSTRACT

A method and apparatus for mitigating offsets in an interpolator are disclosed. In the method and apparatus, a first number of clock cycles of a first clock signal observed over a first clock cycle of a second clock signal is determined and then stored. Also a second number of clock cycles of the first clock signal observed over a second clock cycle of the second clock signal subsequent to the first clock cycle is determined and stored. The first number of clock cycles and the second number of clock cycles are compared to determine whether they are different from each other. If they are different from each other, a reset signal is asserted under control of the second clock signal to reset at least one of a derivator stage and an integrator stage of an interpolator.

19 Claims, 7 Drawing Sheets

RESET CIRCUITRY FOR MITIGATING OFFSETS IN A MEMS DEVICE INTERPOLATOR

BACKGROUND

Technical Field

This application is directed to a device for resetting an interpolator and in particular to a device that resets the interpolator when conditions imposed on clock signals driving the interpolator are not met.

Description of the Related Art

Interpolators, including Cascaded Integrator-Comb (CIC) interpolators, operate under the control of clock cycles having different clock frequencies. Typically, an interpolator that increases the sampling rate of input data by a factor of M is driven by two clock signals, whereby the frequency of the first of the two clock signals is an M-integer multiple of the frequency of the second of the two clock signals. Oftentimes, the input data will be sampled at a frequency equal to that of the second clock signal and the output data is desired to be sampled at a frequency that matches that of the first clock signal.

If the frequencies deviate from the M-integer multiple relationship, the timing of the operation of the interpolator will be disrupted resulting in the introduction of a direct current (DC) offset in the output data. The DC offset taints the output data and renders the output data of the interpolator unreliable.

BRIEF SUMMARY

Disclosed herein is a device summarized as including an interpolator that includes an integrator stage configured to be driven by a first second clock signal having a first clock frequency and a derivator stage coupled to the integrator stage and configured to be driven by a second clock signal having a second clock frequency. The device also includes a counter stage having an input terminal configured to receive the first clock signal, whereby the counter stage is configured to count a number of clock cycles of the first clock signal, apply a modulo-M function to the number of clock cycles, and output a first number that is an outcome of applying the modulo-M function to the number of clock cycles, whereby M is an integer that represents a desired ratio of the first clock frequency to the second clock frequency.

The device includes a memory stage coupled to the counter stage and configured to receive the first number and store the first number under control of the second clock signal. The memory is also configured to receive a second number, which was output by the rounding counter stage prior to the first number, and store the second number under control of the second clock signal. The device includes a comparator stage coupled to an output of the memory stage and configured to receive the first and second numbers and determine if the first and second numbers are different from each other and a reset stage coupled to an output of the comparator stage and configured to reset at least one of the derivator stage and the integrator stage if the first and second numbers are different from each other.

Disclosed herein is a device including a counter stage having an input terminal configured to receive a first clock signal. The counter stage is configured to count a number of clock cycles of the first clock signal, apply a modulo-M function to the number of clock cycles, and output a first number that is an outcome of applying the modulo-M function to the number of clock cycles, wherein M is an integer representing a desired ratio of a first clock frequency of the first clock signal to a second clock frequency of the second clock signal. The device includes a memory stage coupled to the counter stage and configured to receive the first number and store the first number. The memory is further configured to receive a second number, which was output by the rounding counter stage prior to the first number, and store the second number.

The device also includes a comparator stage coupled to an output of the memory stage and configured to receive the first and second numbers and determine if the first and second numbers are different from each other and a reset stage coupled to an output of the comparator stage and configured to output a reset signal having a first logical state if the first and second numbers are different from each other.

Disclosed herein is a method that includes determining a first number of clock cycles of a first clock signal observed over a first clock cycle of a second clock signal, storing the first number of clock cycles, determining a second number of clock cycles of the first clock signal observed over a second clock cycle of the second clock signal subsequent to the first clock cycle, storing the second number of clock cycles, determining that the first number of clock cycles and the second number of clock cycles are different from each other and in response to determining that the first number of clock cycles and the second number of clock cycles are different from each other, asserting, under control of the second clock signal, a reset signal to reset at least one of a derivator stage and an integrator stage of an interpolator.

DETAILED DESCRIPTION

Figure 1:
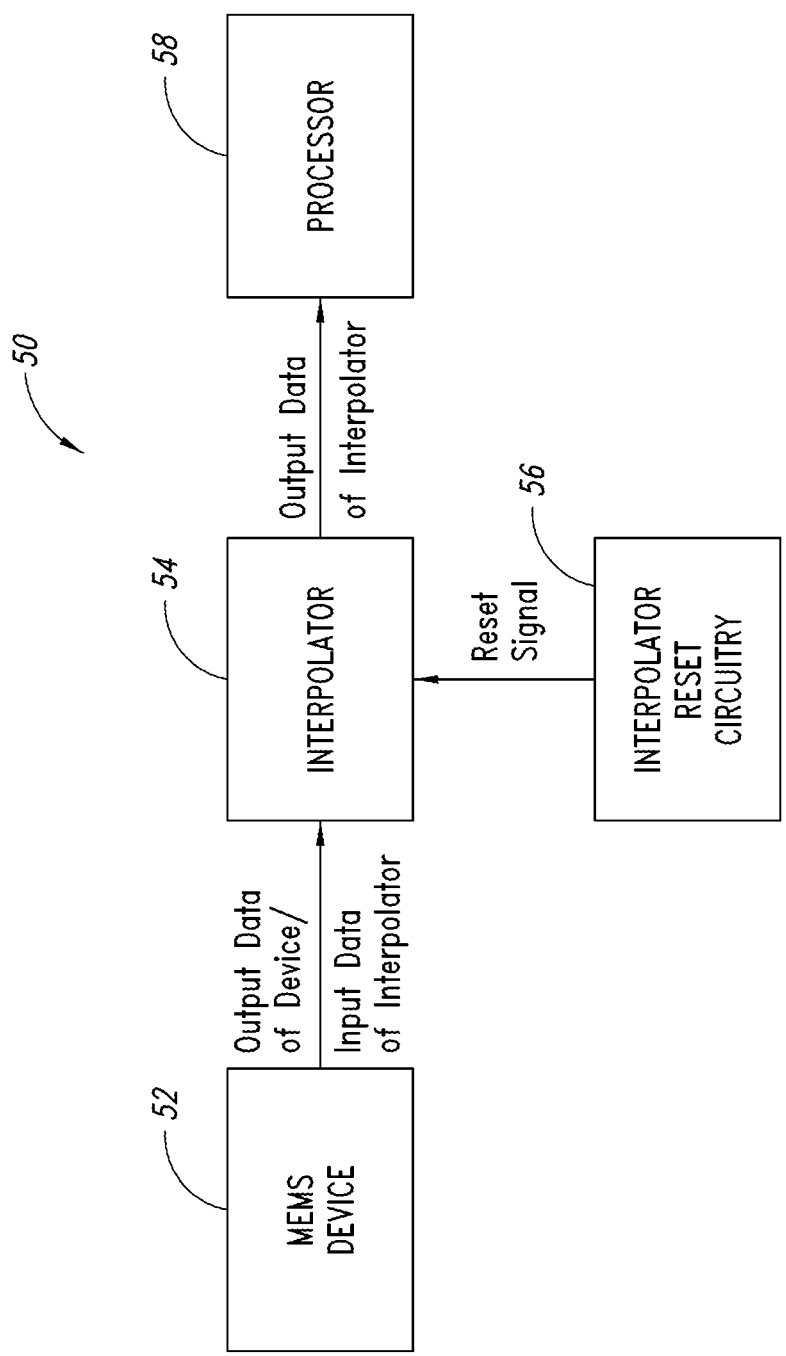
FIG. 1 shows a block diagram of a system including a microelectromechanical systems (MEMS) device.

FIG. 1 shows a block diagram of a system 50 including a microelectromechanical systems (MEMS) device 52. The system 50 may be a smartphone, tablet or drone, among many others. In addition to the MEMS device 52, the system 50 includes an interpolator 54, reset circuitry 56 for the interpolator and a processor 58. The MEMS device 52 may be a gyroscope or an accelerometer, among others. The MEMS device 52 outputs data that may, for example, represent a measurement made by the MEMS device 52. The output date of the MEMS device 52 may be sought to be provided to the processor 58 for evaluation.

The output data rate of the MEMS device 52 may have a first data rate that is lower than that desired or acceptable by the processor 58. Accordingly, the interpolator 64 is used to increase the rate of the output data of the MEMS device 52. The output date of the MEMS device 52 is provided to the interpolator 54. The interpolator 54 receives the output data of the MEMS device 52. The interpolator 54 changes the sampling rate of the output data of the MEMS device 52. In turn, the interpolator 54 provides output data that is samples at a rate compatible with or desired by the processor 58. The output data of the interpolator 54 is then provided to the processor 58.

Operation of the interpolator 54 is dependent on the timing of clock signals as described herein. The reset circuitry 56 detects when the timing of the clock signals deviates from a desired criterion. If deviation of the clock signals is detected, the reset circuitry 56 outputs a reset signal having a defined logical state to the interpolator 54. The interpolator 54 receives the reset signal having the defined logical state. The interpolator 54 is reset in response to receiving the reset signal.

Figure 2:
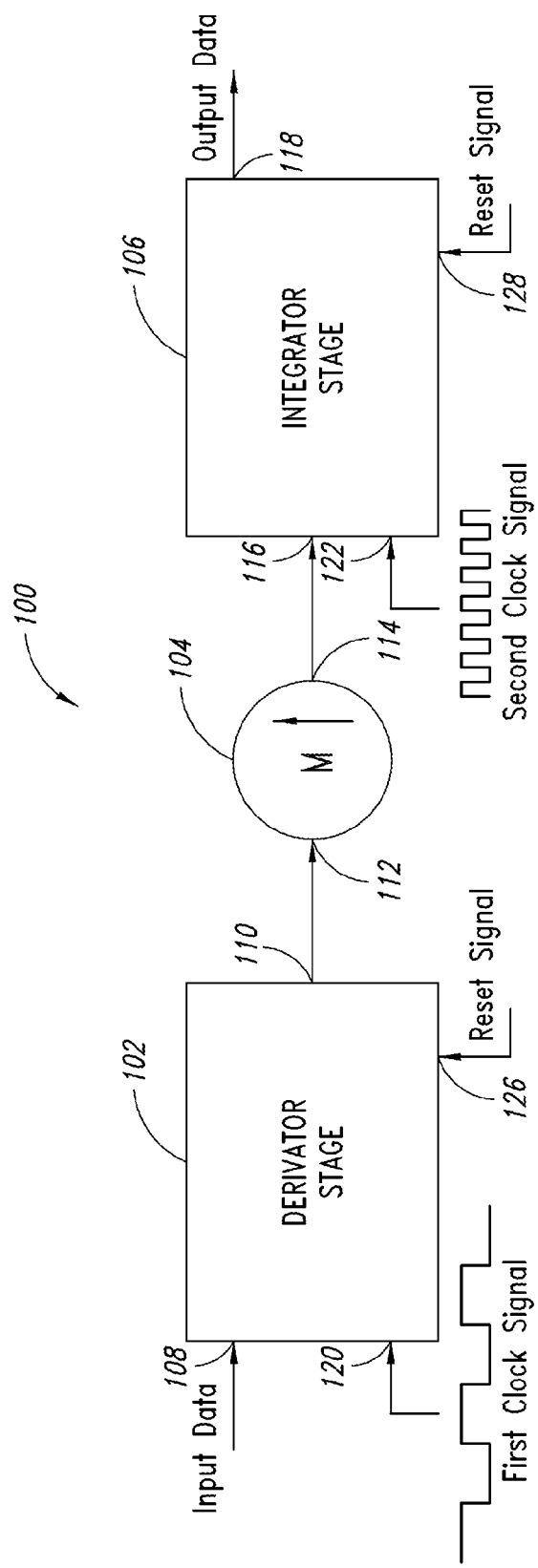
FIG. 2 shows a block diagram of an interpolator in accordance with at least one embodiment.

FIG. 2 shows a block diagram of an interpolator 100 in accordance with at least one embodiment. The interpolator 100 comprises a derivator stage 102, an up-sampler 104 and an integrator stage 106 that are serially coupled. The interpolator 100 is used for changing the sampling rate (or sampling frequency) of data from one sampling rate to another. Input data for the interpolator 100 may be sampled at a first frequency. The interpolator 100 may change the sampling frequency of the input data and provide output data that is sampled at a second frequency, whereby the second frequency is an integer multiple of the first frequency. Hereinafter, the integer multiple is denoted as 'M'.

As shown in FIG. 2, the derivator stage 102 has an input data terminal 108 and an output terminal 110. The up-sampler 104 has an input terminal 112 that is coupled to the output terminal 110 of the derivator stage 102. The up-sampler 104 has an output terminal 114 that is coupled to an input terminal 116 of the integrator stage 106. The integrator stage 106 also has an output data terminal 118 for outputting output data.

The derivator stage 104 and the integrator stage 106 have respective input clock terminals 120, 122 for receiving clock signals that drive the timing operations of the derivator stage 104 and the integrator stage 106, respectively. The derivator stage 104 and the integrator stage 106 have respective reset terminals 124, 126 for receiving respective reset signals. Depending on the configurations of the derivator stage 104 and the integrator stage 106, the respective reset signals may be negated before being provided to the reset terminals 124, 126.

During operation of the interpolator, the derivator stage 104 receives input data over the input data terminal 108. The input data may be sampled at the first frequency. The derivator stage 104 also receives, over its input clock terminal 120, a first clock signal having a clock frequency that is the first frequency. The derivator stage 104 operates on the input data and outputs derived data over its output terminal 110. The principle operation of the derivator stage 104 includes subtracting delayed input data from recent input data to produce derived data and outputting the derived data to the up-sampler 104. The derived data is also sampled at the first frequency.

The up-sampler 104 receives the derived data over its input terminal 112. The derived data, at this point, has the same sampling frequency as that of the input data. The up-sampler 104 up-samples the derived data. Up-sampling the derived data may include padding the derived data such that the proportion of padded bits to the bits of the derived data satisfies some criterion. For example, the up-sampler 104 may up-sample the derived data by a factor of M and may, accordingly, pad or stuff M−1 zeros bits for every bit of derived data to produce data that is sampled at an M integer multiple of the derived data. The up-sampler 104 outputs, over its output terminal 114, the up-sampled data.

The integrator stage 106 receives the up-sampled data over its input terminal 116. The integrator stage 106 also receives a second clock signal 122 at its input clock terminal 122. The second clock signal 122 has a clock frequency that is equal to that of the second frequency. The integrator stage 106 derives its timing operation from the second clock signal 122. The integrator stage 106 operates on the up-sampled data and outputs output data at its output data terminal 118. The integrator stage 106 may be a recursive running-sum filter that accumulates delayed derived data from recent derived data to produce output data. The output data is sampled at the second frequency, which as described herein is an M-integer multiple of the sampling frequency of the input data.

Because the first clock signal and the second clock signal control the operation of the derivator stage 102 and the integrator stage 106, respectively, it is important for a strict timing relation between the first clock signal and the second clock signal to be enforced for the interpolator 100 to operate properly. That is, it is important for the second frequency of the second clock signal to be an M-integer multiple of the first frequency of the first clock signal. If the ratio between the two frequencies deviates from M, a direct current (DC) offset will be introduced in the output signal. For example, if one or more clock cycles of the first clock signal or the second clock signal are shortened or lengthened, the interpolator 100 will introduce a DC offset in the output data.

As described herein, a reset circuitry is provided that evaluates the timing relation of the first and second clock signals. If the frequencies of the first and second clock signals are found not to meet the M-integer-multiple relationship, a reset signal is asserted. The reset signal is received by the derivator stage 102 and the integrator stage 106 at their respective reset terminals 124, 126. When the reset signal is asserted, the output data provided by the interpolator at the output data terminal 118 is forced to a predetermined logical value, such as logical zero.

Resetting the interpolator 100 avoids providing an output data that is tainted by the DC offset resulting from deviation of the first and second clock signals from their desired timing relationship. Once the desired timing relationship is restored, the reset circuitry de-asserts the reset signal. The derivator stage 102 and the integrator stage 106 receive the de-asserted reset signal at their respective reset terminals 124, 126. The derivator stage 102 and the integrator stage 106 return to operation, whereby the derivator stage 102 and the integrator stage 106 derive their timing from the respective first clock signal and second clock signal.

Figure 3:
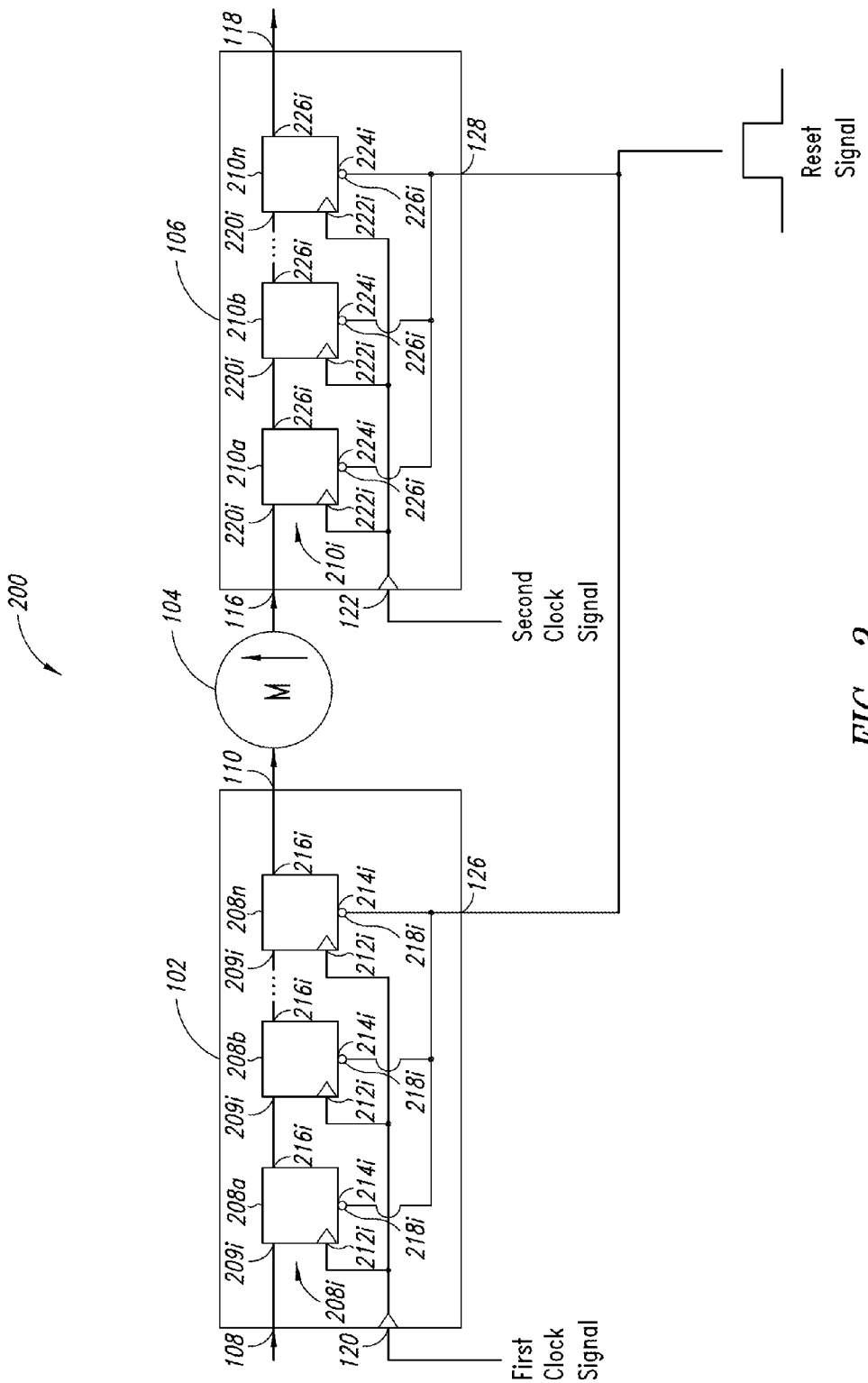
FIG. 3 shows a block diagram of an interpolator in accordance with at least one embodiment.

FIG. 3 shows a block diagram of an interpolator 200 in accordance with at least one embodiment. Similar elements of the interpolator 200 described with reference to FIG. 3 as those of the interpolator 100 described with reference to FIG. 2 have similar reference numerals. The interpolator 200 comprises the derivator stage 102, the up-sampler 104 and the integrator stage 106.

The derivator stage 102 comprises a plurality of derivators 208a-n (collectively referred to herein as derivators 208i) and the integrator stage 106 comprises a plurality of integrators 210a-n (collectively referred to herein as integrators 210i). Each derivator 208i (has an input data terminal 209i, an input clock terminal 212i, a reset terminal 214i and an output data terminal 216i.

The plurality of derivators 208i are serially coupled. A first derivator 208a of the plurality of derivators 208i has its input data terminal 209$i$ coupled to the input data terminal 108 of the derivator stage 102 and its output data terminal 216$i$ coupled to the input data terminal 209$b$ of a second derivator 208$b$ of the plurality of derivators 208$i$. If the second derivator 208$b$ is a last derivator of the serially coupled plurality of derivators 208$i$, the second derivator 208$b$ will have its output data terminal 216$i$ coupled to the output data terminal 110 of the derivator stage 102. Conversely, if the second derivator 208$b$ is an intermediary derivator that is coupled between two other derivators, the second derivator 208$b$ will have its output data terminal 216$i$ coupled to the input data terminal 209$i$ of a subsequent third derivator 208$c$ (not shown) of the plurality of derivators 208$i$. It is noted that in some embodiments, the derivator stage 102 may only have one derivator 208$a$ and the input data terminal 209$i$ and output data terminal 216$i$ of the derivator 208$a$ will be respectively coupled to the input data terminal 108 and the output data terminal 110 of derivator stage 102.

Each derivator 208$i$ has its input clock terminal 212$i$ coupled to the input clock terminal 120 of the derivator stage 102 and a reset terminal 214$i$ coupled to the reset terminal 126 of the derivator stage 102 with a negator 218$i$ coupled therebetween. A derivator 208$i$ receives data at its input data terminal 209$i$, delays the received data and subtracts the received data from subsequently received data to produce output data. The output data is provided to a next serially coupled derivator 208$i$ that similarly operates on the data. If the derivator 208$i$ is the last of the derivator stage 102, the output data is instead provided as the derived data.

Each integrator 210$i$ (having the subscript 'i') has an input data terminal 220$i$, an input clock terminal 222$i$, a reset terminal 224$i$ and an output data terminal 226$i$. The plurality of integrators 210$i$ are serially coupled similar to the plurality of derivators 208$i$. The integrator 210$i$ receives input data, delays the input data and accumulates the delayed input data with subsequently received input data. The result of the accumulation is provided as output data. The output data of the integrator 210$i$ is provided to a next serially coupled integrator 210$i$ to be similarly operated on. In the case that the integrator 210$i$ is the last of the integrator stage 106, the output data is provided as the output data of the integrator stage 106.

A first integrator 210$a$ of the integrators 210$i$ has its input data terminal 220$i$ coupled to the input data terminal 116 of the integrator stage 106 and its output data terminal 226$i$ coupled to the input data terminal 220$i$ of a second integrator 210$b$ of the plurality of integrators 210$i$. If the second integrator 210$b$ is a last integrator of the serially coupled plurality of integrators 210$i$, the second integrator 210$b$ will have its output data terminal 226$i$ coupled to the output data terminal 118 of the integrator stage 106. Conversely, if the second integrator 210$b$ is an intermediary integrator of the serially coupled plurality of integrators 210$i$, the second integrator 210$b$ will have its output data terminal 226$i$ coupled to the input data terminal 220$i$ of a subsequent third integrator 208$c$ (not shown) of the plurality of integrators 208$i$. It is noted that in some embodiments, the integrator stage 106 may only have one integrator 210$a$ and the integrator's 210$a$ input data terminal 220$i$ and output data terminal 226$i$ will be respectively coupled to the input data terminal 116 and the output data terminal 118 of integrator stage 106.

Each integrator 210$i$ has its input clock terminal 222$i$ coupled to the input clock terminal 122 of the integrator stage 106 and its reset terminal 224$i$ coupled to the reset terminal 128 of the integrator stage 106 with a negator 226$i$ coupled therebetween.

To reset the interpolator 200, the output data of the interpolator 200 may be forced to a logical zero. Resetting the interpolator 200 may include resetting the integrator stage 106, the derivator stage 102 or both in order to make the output of the stages 102, 106 a logical zero.

As is known in the art a derivator 208$i$ may comprise a shift register and a subtractor. Further, an integrator 210$i$ may comprise a shift register and an adder. To reset the derivator stage 102, a reset signal having a predetermined logical state may be sent to the shift registers of the plurality of derivators 208$i$ of the derivator stage 102. Receipt of the reset signal having a predetermined logical state will force the outputs of the shift registers to a logical state (such as zero), thereby forcing the output of the interpolator 200 as a whole to that logical state.

Similarly, to reset the integrator stage 106, the reset signal having a predetermined logical state may be sent to the shift registers of the plurality of integrators 210$i$ of the integrator stage 106. Receipt of the reset signal having a predetermined logical state will force the outputs of the shift registers of the plurality of integrators 210$i$ to a logical state (such as zero), thereby forcing the output of the interpolator 200 as a whole to that logical state.

Figure 4:
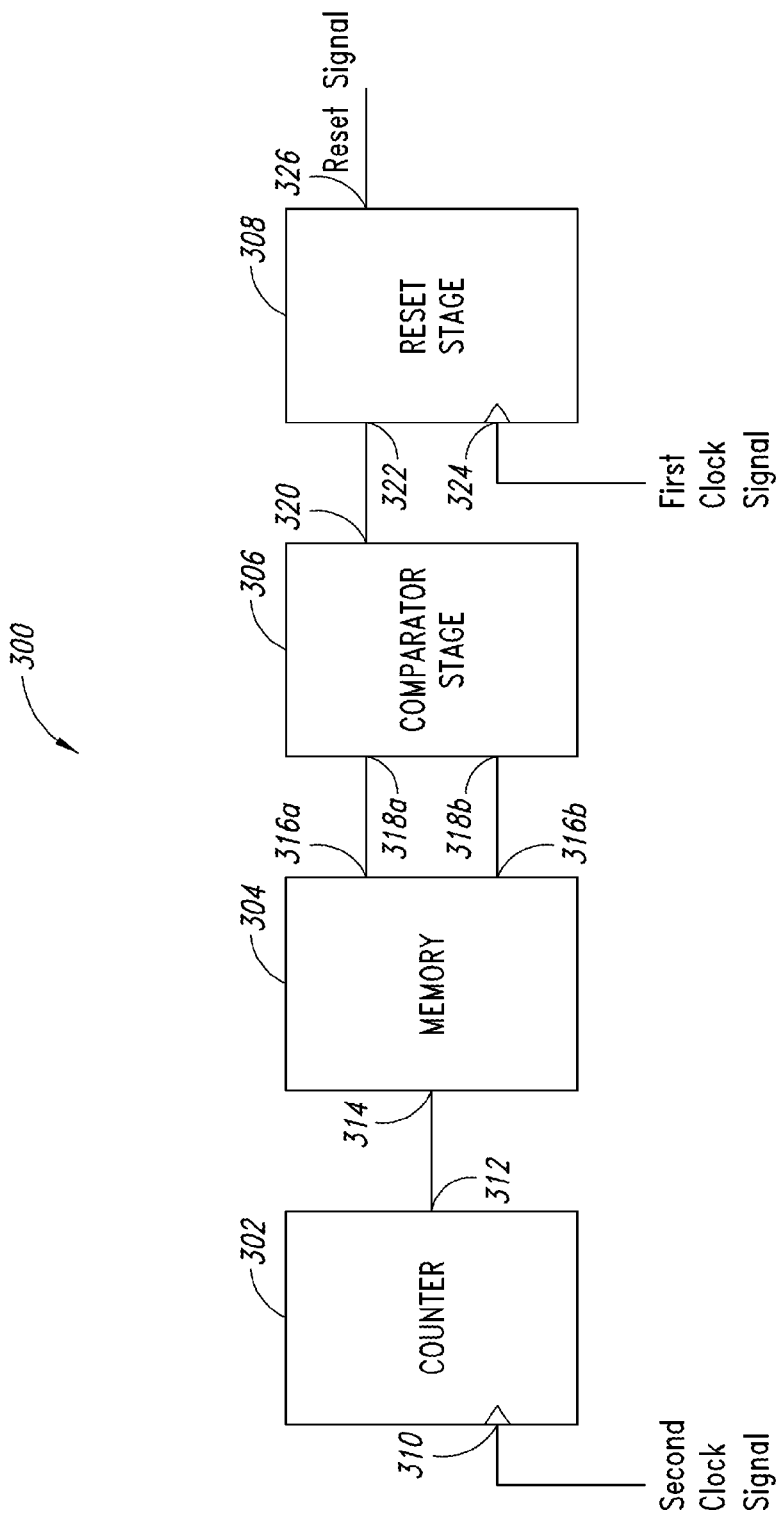
FIG. 4 shows reset circuitry for an interpolator.

FIG. 4 shows reset circuitry 300 for an interpolator. The reset circuitry 300 may be used to reset any interpolator, such as the interpolator 100 described with reference to FIG. 2 or the interpolator 200 described with reference to FIG. 3. The reset circuitry 300 comprises a counter 302, memory 304, a comparator stage 306 and a reset stage 308. The counter 302 has a clock input terminal 310 for receiving the second clock signal and an output terminal 312. The output terminal 312 of the counter 302 is coupled to an input terminal 314 of the memory 304.

The memory as described herein may be a register, a flip-flip or bank of flip-flops, among others. The memory 304 has two output terminals 316$a,b$ that are respectively coupled to two input terminals 318$a,b$ of the comparator stage 306. The comparator stage 306 has an output terminal 320 coupled to an input terminal 322 of the reset stage 308. The reset stage 308 also has a clock input terminal 324 for receiving the first clock signal and an output terminal 326 for outputting a reset signal to an interpolator.

During operation of the reset circuitry 300, the counter 302 receive the second clock signal at its clock signal input terminal 310. The counter 302 counts the number of clock cycles of the second clock signal and outputs the number of clock cycles at its output terminal 312. The number of clock signals may be counted over a duration of the first clock signal. The counter 302 may be a running counter that continuously counts the number of clock cycles of the second clock signal and outputs the counted number of clock cycles. Alternatively, the counter 302 may be a rounding counter that outputs an outcome of a modulo function applied to the number of clock cycles of the second clock signal. The modulo function may be a modulo-M function, whereby M as described herein is the desired ratio of the second clock frequency to the first clock frequency.

By way of example, M may be eight and over a first clock cycle of the first clock signal, the counter 302 counts eight clock cycles of the second clock signal. Because the counted number of clock cycles is the same as M, neither the first or second clock signals have deviated from the desired ratio. Over a second clock cycle of the first clock signal, the counter 302 may count six clock cycles of the second clock signal. Accordingly, over the second clock cycle the first and second clock signals have deviated from the desired ratio. If the counter 302 is a rounding counter, the counter 302 may output a count of zero for the first clock cycle of the first clock signal and a count of six for the second clock cycle of the first clock signal. Furthermore, the counter 302 may be initialed at value different than zero and accordingly may output any two numbers (between 0 and 7) that offset by two from one another according to this scenario. If the count for the first clock cycle is six, then the count for the second clock cycle will be four given that the count is an outcome of the modulo-8 operation and the fact that the second clock cycle of the first clock signal spans six rather than eight clock cycles of the first clock signal. The respective counts may also be one and seven.

The memory 304 receives the first number of clock cycles and the second number of clock cycles over its input terminal 314 and stores the first and second numbers of clock cycles. The memory 304 outputs the first number of clock cycles over the first output terminal 316a and the second number of clock cycles over the second output terminal 316b. The comparator stage 306 receives the first number of clock cycles and the second number of clock cycles over its respective input terminals 318a,b and compares the two numbers. If the first and second numbers of clock cycles are different from each other, the comparator stage 306 outputs, over its output terminal 320, an output signal that is asserted. The asserted output signal is used to reset the interpolator.

Conversely, if the first and second numbers of clock cycles are not different from each other, the comparator stage 306 outputs an output signal that is deasserted.

The reset stage 308 receives the output signal over its input terminal 322 and receives the first clock signal over its clock input terminal 324. Based on the output signal and the first clock signal, the reset stage 308 outputs a reset signal over its output terminal 326. The reset signal, when asserted, resets the interpolator.

The first clock signal controls the timing of asserting the reset signal. It is desirable to avoid resetting the interpolator mid-cycle of the first clock signal. It is preferable to only reset the interpolator for an entire duration of one or more clock cycles of the first clock signal. To do so, the reset stage 308 awaits the beginning (for example, rising edge) of a clock cycle of the first clock signal and asserts the reset signal if the output signal of the comparator stage 306 is asserted. If the output signal transitions from the asserted state to the de-asserted state, the reset stage 308 awaits the beginning of a clock cycle of the first clock signal to de-assert the reset signal Accordingly, the reset circuitry 300 determines two numbers of clock cycles of the second clock signals observed in each of two consecutive clock cycles of the first clock signal and compares the two numbers of clock cycles. If the two numbers of clock cycles are the same the reset circuitry 300 does not reset the interpolator. If the two numbers of clock cycles are different, the reset circuitry 300 resets the interpolator. The timing of the first clock signal is adhered to when resetting the interpolator such that the interpolator is only reset for an entire duration of the first clock cycle.

Figure 5:
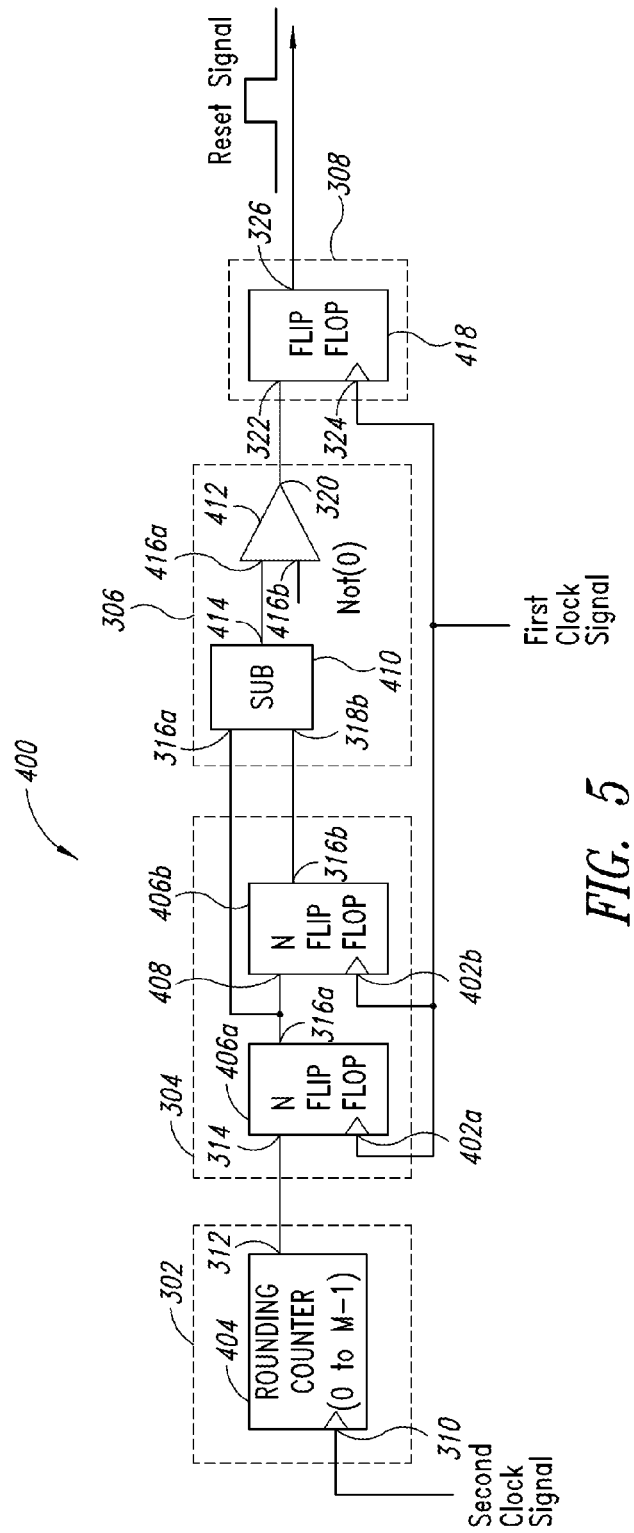
FIG. 5 shows reset circuitry for an interpolator in accordance with one embodiment.

FIG. 5 shows reset circuitry 400 for an interpolator in accordance with one embodiment. The reset circuitry 400 may be used to reset any interpolator, such as the interpolator 100 described with reference to FIG. 2 or the interpolator 200 described with reference to FIG. 3. The reset circuitry 400 includes specific implementations of the counter 302, the memory 304, the comparator stage 306 and the reset stage 308 of the reset circuitry 300 of FIG. 4. The memory has clock input terminals 402a,b for receiving the first clock signal. The counter 302 includes a rounding counter 404 having the clock input terminal 310 for receiving the second clock signal and the output terminal 312.

The memory 304 includes a first flip-flip bank 406a and a second flip-flop bank 406b that are serially coupled. The first flip-flip bank 406a has the input terminal 314 coupled to the output terminal 312 of the rounding counter 404. The first flip-flip bank 406a receives the first clock signal over the first clock input terminal 402a of the memory 304. The first flip-flip bank 406a has the first output terminal 316a coupled to an input terminal 408 of the second flip-flip bank 406b. The first output terminal 316a is also coupled to the first input terminal 318a of the comparator stage 308. The second flip-flip bank 406b receives the first clock signal over the second clock input terminal 402b. The second flip-flip bank 406b also has an input 408 coupled to the first output terminal 316a 308. The second flip-flip bank 406b also has the second output terminal 316b coupled to the second input terminal 318b of the comparator stage 308.

The comparator stage 306 includes a subtractor 410 and a comparator 412. The subtractor 410 has the first and second input terminals 318a of the comparator stage 306. The subtractor 410 has an output terminal 414 that is coupled to a first input terminal 416a of the comparator 412. The comparator 412 has a second input terminal 416b for receiving a signal indicative of a value different from zero. The comparator 412 also has the output terminal 320.

The reset stage 308 comprises a flip-flip 418 having the input terminal 322, the clock input terminal 324 for receiving the first clock signal and the output terminal 326 for outputting the reset signal to an interpolator.

Operation of the reset circuitry 400 over a plurality of clock cycles of the first clock signal is described herein. The rounding counter 404 receives the second clock signal at the clock input terminal 310 and determines a count of the number of clock cycles of the second clock signal. The rounding counter 404 continuously outputs the counted number of clock cycles over the output terminal 312. The number of clock cycles may be output as an outcome of a modulo-M function applied to the counted number of clock cycles as described herein.

At the end of a first clock cycle of the first clock signal, which coincides with the beginning (rising edge) of a second clock cycle of the first clock signal, the first flip-flip bank 406a receives, over the input terminal 314, a first number of clock cycles counted by the rounding counter 404. The first number of clock cycles represents the number of clock cycles counted by the rounding counter 404 over the first clock cycle. The first flip-flip bank 406a stores the first number of clock cycles and outputs the first number of clock cycles at the first output terminal 316a.

At the end of the second clock cycle (for example, the rising edge of a third clock cycle subsequent to the second clock cycle), the first flip-flip bank 406a receives, over the input terminal 314, a second number of clock cycles counted by the rounding counter 404. The second number of clock cycles represents the number of clock cycles counted by the rounding counter 404 over the second clock cycle.

Coinciding with receipt of the second number of clock cycles by the first flip-flip bank 406a, the end of the second clock cycle (or commencement of the third clock cycle) triggers the second flip-flip bank 406b to receive the first number of clock cycles stored by the first flip-flip bank 406a. The second flip-flip bank 406b receives, at its input terminal 408, the first number of clock cycles (as output by the first output terminal 316a of the first flip-flip bank 406a). The second flip-flip bank 406b stores the first number of clock cycles and outputs the first number of clock cycles at its second output terminal 316b.

The arrangement of the first flip-flip bank 406a and the second flip-flip bank 406b results in storing two numbers of clock cycles of the second clock signal respectively counted over two consecutive clock cycles of the first clock signal. The arrangement also results in outputting the two numbers (over the first output terminal 316a and the second output terminal 316b) for comparison by the comparator stage 306.

The subtractor 410 receives the first number of clock cycles and the second number of clock cycles over its second input terminal 318b and first input terminal 318a, respectively. The subtractor 410 outputs a difference between the two numbers of clock cycles over its output terminal 414. If the two numbers of clock cycles are the same, the subtractor 410 outputs an output signal indicating that the difference between the two numbers is zero. Conversely, if the two numbers of clock cycles are different from each other, the output signal of the subtractor 410 indicates the difference between the two numbers of clock cycles.

The comparator 412 receives the output signal of the subtractor 410 at its first input terminal 416a and compares the output signal to an input signal received over its second input terminal 416b. If the comparison yields that the two numbers of clock cycles are different from each other, the comparator 412 outputs an output signal over its output port 320 that is asserted. If the two numbers of clock cycles are the same, the output signal of the comparator 412 is de-asserted.

The flip-flop 418 of the reset stage 308 receives the output signal of the comparator 412 at its input terminal 322 and the first clock signal over its clock input terminal 324. The flip-flop 418 bases the state of its output reset signal on the state of the output signal of the comparator 412 as observed at the beginning of a clock cycle of the first clock signal. If the output signal of the comparator 412 is asserted, the flip-flop 418 asserts the reset signal at the beginning of a subsequent clock cycle of the first clock signal. The subsequent clock cycle being after the first and second clock cycles of the first clock signal.

Figure 6:
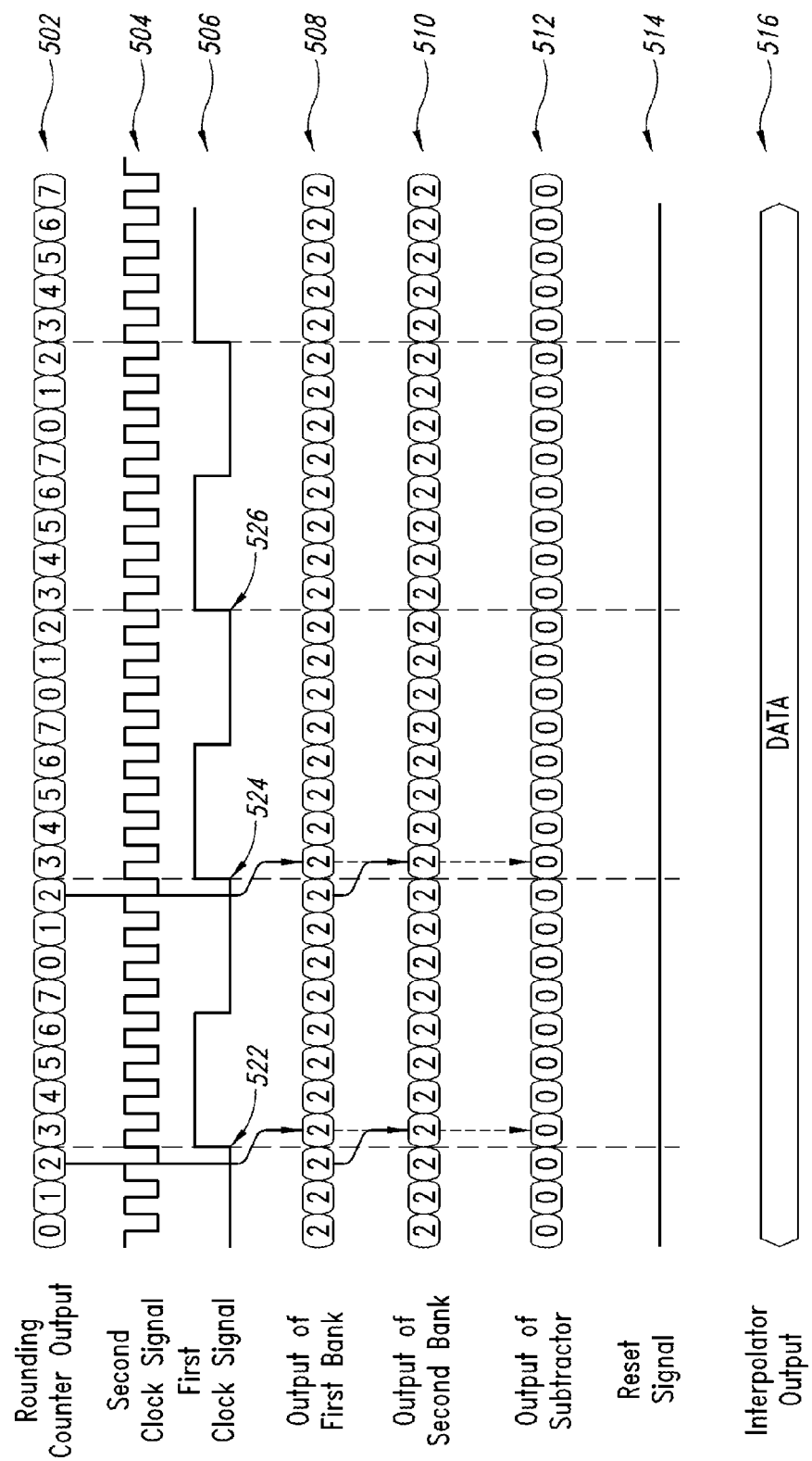
FIG. 6 shows timing diagrams of operation of the reset circuitry.

FIG. 6 shows timing diagrams of operation of the reset circuitry 400. Diagram 502 shows the output of the rounding counter 302. The output of the rounding counter 302 represents the number of clock cycles of the second clock signal (shown in diagram 504) that are counted by the rounding counter 302. The number of clock cycles is an outcome of a molulo-8 function applied to a maintained running count of the number of clock cycles of the second clock signal.

At the beginning (time point 522 in FIG. 6) of a first clock cycle of the first clock signal (shown in diagram 506), the first flip-flop bank receives the number of clock cycles output by the rounding counter and outputs the number of clock. At the beginning (time point 524 in FIG. 6) of a second clock cycle of the first clock signal, the first flip-flop bank receives the number of clock cycles output by the rounding counter and outputs the number of clock cycles. Coinciding with the operation of first flip-flop bank, the second flip-flop bank receives the number of clock cycles stored by the first flip-flop bank. The second flip-flop bank stores and outputs the received number of clock cycles (shown in diagram 510).

The comparator stage compares the outputs of the first flip-flop bank and the second flip-flop bank. Because the outputs of the first flip-flop bank and the second flip-flop bank are the same, the subtractor output of the comparator stage shown in diagram 512 is zero at the both the first time point 522 and the second time point 524 as well as a third time point 526 that is the start of a third clock cycle of the first clock signal. As a result, the reset signal of diagram 514 is not asserted and the interpolator is not reset. The interpolator outputs data as shown in diagram 516. The interpolator is not shut off or reset because the number of clock cycles of the second clock signal counted over each clock cycles of the first clock signal remains the same at eight, which is the value of M.

Figure 7:
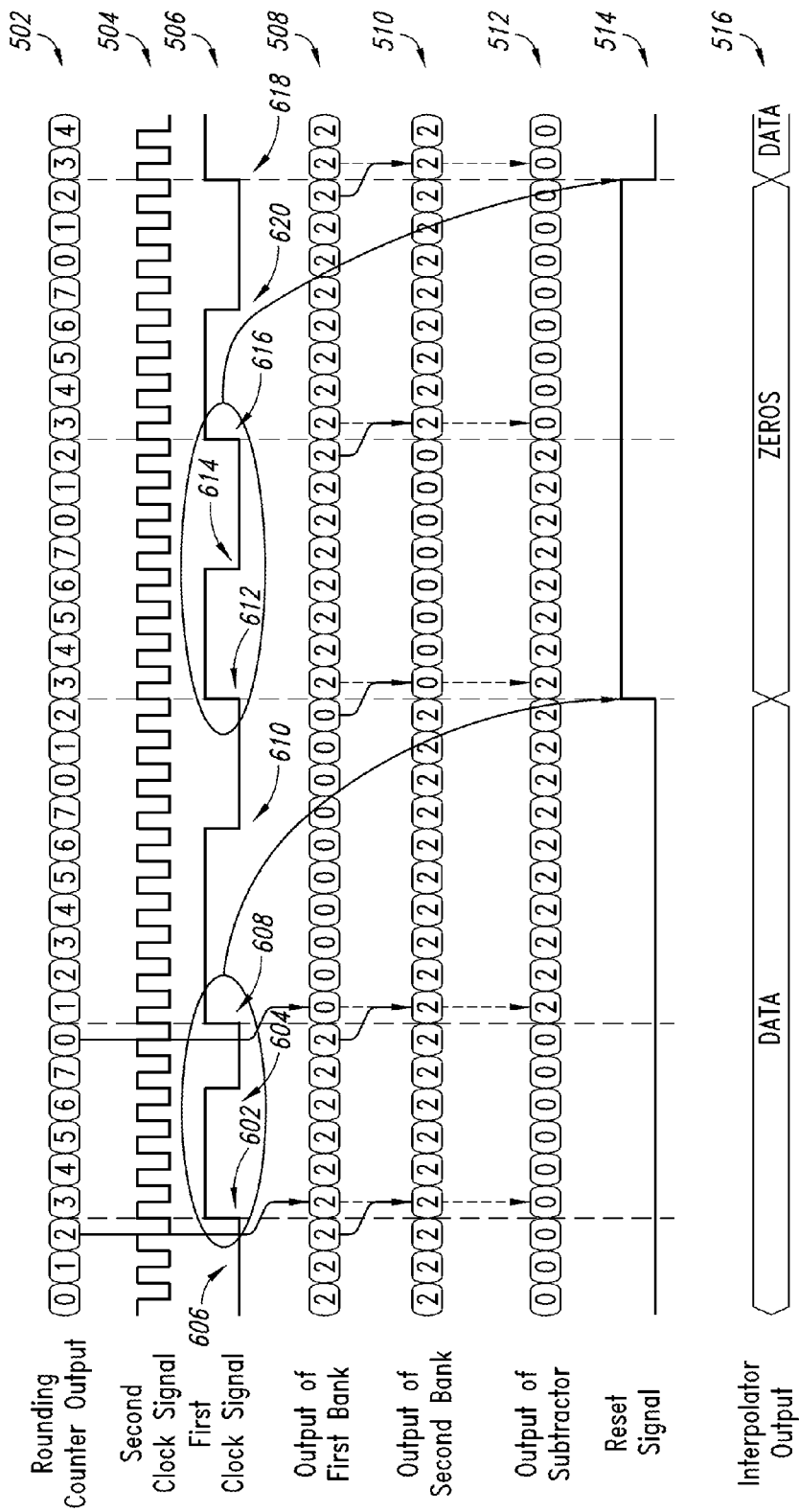
FIG. 7 shows timing diagrams of operation of the reset circuitry.

FIG. 7 shows timing diagrams of operation of the reset circuitry 400. The rounding counter continuously counts the number of clock cycles of the second clock signal. The rounding counter outputs the number of clock cycles as an outcome of a modulo-8 function applied to the counted number of clock cycles, whereby the desired ratio of the second frequency of the second clock signal to the first frequency of the first clock signal is eight. At a first time point 602 that represents the beginning of a first clock cycle 604 of the first clock signal, the output of the rounding counter shown in diagram 502 is "2". The number of clock cycles is then received, stored and output by the first flip-flop bank. The second flip-flop bank stores the number of clock cycles counted over a previous clock cycle 606 of the first clock signal preceding the first clock cycle. The number of clock cycles stored by the second flip-flop bank is also "2". Because the number of clock cycles stored by both flip-flop banks is the same, the output of the subtractor at the first time point 602 is zero and the reset signal is not asserted.

The first clock cycle 604 of the first clock signal is shorter than desired as indicated by the fact that it spans six clock cycles of the second clock signal as opposed to an desired eight clock cycles. Accordingly, at a second time point 608 (which is the end of the first clock cycle 604 of the first clock signal and the beginning of a second clock cycle 610 of the first clock signal), the output of the rounding counter registers at a "0" instead of an expect "2" had the length of the first clock cycle of the first clock signal spanned eight clock cycles of the second clock signal.

At the second time point 608, the first flip-flop bank receives the "0" value output by the rounding counter and outputs the "0" value. Further, the second flip-flop bank receives the "2" value output by the first flip-flop bank. Subsequently, the output of the subtractor will be a value different than zero, i.e., 2. To avoid changing the state the of the interpolator mid-cycle, the reset signal is not asserted until a third time point 612 is reached. The third time point 612 is the time point where the second clock cycle 610 ends and a subsequent third clock cycle 614 of the first clock signal begins. At the third time point 612, the reset signal is asserted and the output of the interpolator is driven to zero for the remainder of the third clock cycle. It is noted that the interpolator may alternatively be driven to another logical state as a result of assertion of the reset signal.

The reset signal is de-asserted after a clock cycle of the first clock signal is detected to include M clock cycles of the second clock signal. As shown in diagram 506, the third clock cycle 614 covers eight clock cycles of the second clock signal. Following commencement of the third clock cycle 614 at a fourth time point 616, the output of the subtractor is zero. However, as described herein it is desirable for the reset signal not to change states mid-cycle. Accordingly, due to operation of the flip-flop 418 of the reset stage 308, the reset signal is de-asserted at a fifth time point 618 marking when the fourth clock cycle 620 immediately following the third clock cycles 614 ends. When the reset signal is de-asserted, the interpolator is not driven to a particular logical state and instead resumes outputting data as shown in diagram 516.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
   an interpolator including:
      an integrator stage configured to be driven by a first second clock signal having a first clock frequency; and
      a derivator stage coupled to the integrator stage and configured to be driven by a second clock signal having a second clock frequency;
   a counter stage having an input terminal configured to receive the first clock signal, the counter stage being configured to count a number of clock cycles of the first clock signal, apply a modulo-M function to the number of clock cycles, and output a first number that is an outcome of applying the modulo-M function to the number of clock cycles, wherein M is an integer representing a desired ratio of the first clock frequency to the second clock frequency;
   a memory stage coupled to the counter stage and configured to receive the first number and store the first number under control of the second clock signal, the memory is further configured to receive a second number, which was output by the rounding counter stage prior to the first number, and store the second number under control of the second clock signal;
   a comparator stage coupled to an output of the memory stage and configured to receive the first and second numbers and determine if the first and second numbers are different from each other; and
   a reset stage coupled to an output of the comparator stage and configured to reset at least one of the derivator stage and the integrator stage if the first and second numbers are different from each other.

2. The device of claim 1, wherein the reset stage resets the at least one of the derivator stage and the integrator stage by outputting a reset signal having a first logical state.

3. The device of claim 2, wherein the at least one of the derivator stage and the integrator stage is coupled to the reset stage and configured to receive the reset signal and output data having a second logical state that is the same or different than the first logical state.

4. The device of claim 1, wherein the first number indicates the number of clock cycles of the first clock signal observed over a first clock cycle of the second clock signal and the second number indicates the number of clock cycles of the first clock signal observed over a second clock cycle of the second clock signal preceding the first clock cycle and wherein the reset stage is configured to reset the at least one of the derivator stage and the integrator stage over a duration of a third clock cycle of the second clock signal subsequent to the first clock cycle and separated from the first clock cycle by at least one intervening clock cycle of the second clock signal.

5. The device of claim 1, wherein the reset stage is configured to reset the at least one of the derivator stage and the integrator stage only for entire durations of clocks cycles of the second clock signal.

6. The device of claim 1, wherein the integrator stage includes a plurality of integrators that are serially coupled and wherein an integrator of the plurality of integrators is coupled to the reset stage and configured to receive a reset signal from the reset stage having a first logical state and in response to receiving the reset signal having the first logical state, output data having a second logical state.

7. The device of claim 1, wherein the derivator stage includes a plurality of derivators that are serially coupled and wherein a derivator of the plurality of derivators is coupled to the reset stage and configured to receive a reset signal from the reset stage having a first logical state and in response to receiving the reset signal having the first logical state, output data having a second logical state.

8. The device of claim 1, wherein the memory stage comprises two cascading flip-flip banks, wherein a first flip-flip bank of the two flip-flip banks is configured to receive and store the first number and a second flip-flip bank of the two flip-flip banks is configured to receive and store the second number.

9. A device comprising:
   a counter stage having an input terminal configured to receive a first clock signal, the counter stage being configured to count a number of clock cycles of the first clock signal, apply a modulo-M function to the number of clock cycles, and output a first number that is an outcome of applying the modulo-M function to the number of clock cycles, wherein M is an integer representing a desired ratio of a first clock frequency of the first clock signal to a second clock frequency of the second clock signal;
   a memory stage coupled to the counter stage and configured to receive the first number and store the first number, the memory is further configured to receive a second number, which was output by the rounding counter stage prior to the first number, and store the second number;
   a comparator stage coupled to an output of the memory stage and configured to receive the first and second numbers and determine if the first and second numbers are different from each other; and
   a reset stage coupled to an output of the comparator stage and configured to output a reset signal having a first logical state if the first and second numbers are different from each other.

10. The device of claim 9, further comprising:
    an interpolator including:
       a derivator stage to be driven by the second clock signal;
       an up-sampler coupled to the derivator stage; and
       an integrator stage coupled to the up-sampler and configured to be driven by the second clock signal.

11. The device of claim 10, wherein the derivator stage is coupled to the reset stage and configured to receive the reset signal and output data having a pre-determined logical state in response to receiving the reset signal having the first logical state.

12. The device of claim 10, wherein the integrator stage is coupled to the reset stage and configured to receive the reset signal and output data having a pre-determined logical state in response to receiving the reset signal having the first logical state.

13. The device of claim 9, wherein the comparator stage is configured to receive a third number and a fourth number from the memory stage subsequent to receiving the second number and determine that the third and fourth numbers are the same as each other, and wherein the reset stage is configured to output the reset signal having a second logical state that is different from the first logical state if the third and fourth numbers are the same as each other.

14. The device of claim 10, wherein at least one of the derivator stage and the integrator stage is configured to receive the reset signal having the second logical state and cease forcing output data to a pre-determined logical state in response to receiving the reset signal having the second logical state.

15. A method, comprising:
  determining a first number of clock cycles of a first clock signal observed over a first clock cycle of a second clock signal;
  storing the first number of clock cycles;
  determining a second number of clock cycles of the first clock signal observed over a second clock cycle of the second clock signal subsequent to the first clock cycle;
  storing the second number of clock cycles;
  determining that the first number of clock cycles and the second number of clock cycles are different from each other; and
  in response to determining that the first number of clock cycles and the second number of clock cycles are different from each other, asserting, under control of the second clock signal, a reset signal to reset at least one of a derivator stage and an integrator stage of an interpolator.

16. The method of claim 15, further comprising:
  determining a third number of clock cycles of the first clock signal observed over a third clock cycle of the second clock signal subsequent to the second clock cycle;
  determining a fourth number of clock cycles of the first clock signal observed over a fourth clock cycle of the second clock signal subsequent to the third clock cycle;
  determining that the third and fourth numbers are the same; and
  in response to determining that the third and fourth numbers are the same, de-asserting, under control of the second clock signal, the reset signal to set at least one of the derivator stage and an integrator stage.

17. The method of claim 16, wherein the third clock cycle succeeds the second clock cycle.

18. The method of claim 15, further comprising:
  maintaining assertion of the reset signal for an entire duration of a third clock cycle subsequent to the second clock cycle.

19. The method of claim 15, further comprising:
  forcing an output of the interpolator to logical zero while the reset signal is asserted.

\* \* \* \* \*